(12) United States Patent
Kim et al.

(10) Patent No.: US 7,448,604 B2
(45) Date of Patent: Nov. 11, 2008

(54) HEAT TREATMENT APPARATUS

(75) Inventors: Tae-gyu Kim, Gyeonggi-do (KR); Dong-woo Lee, Seoul (KR); Jin-sung Lee, Seoul (KR); Tae-sang Park, Suwon-si (KR); Bang-weon Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 492 days.

(21) Appl. No.: 11/058,279

(22) Filed: Feb. 16, 2005

(65) Prior Publication Data
US 2005/0280681 A1 Dec. 22, 2005

(30) Foreign Application Priority Data
Jun. 19, 2004 (KR) .................. 10-2004-0045856

(51) Int. Cl.
*B01F 3/04* (2006.01)
(52) U.S. Cl. .................. 261/152; 261/78.2; 261/115
(58) Field of Classification Search .............. 261/78.2, 261/115, 116, 127, 152, 154, 156, DIG. 33
See application file for complete search history.

(56) References Cited

U.S. PATENT DOCUMENTS

| 1,963,412 | A | * | 6/1934 | Lewis | 261/156 |
| RE19,546 | E | * | 4/1935 | Toepfer | 261/156 |
| 2,564,060 | A | * | 8/1951 | Gettins | 239/428.5 |
| 2,801,087 | A | * | 7/1957 | Hawk | 261/62 |
| 3,954,921 | A | * | 5/1976 | Yoshida et al. | 261/116 |
| 3,969,449 | A | * | 7/1976 | Shires et al. | 261/153 |
| 5,232,164 | A | * | 8/1993 | Resch et al. | 239/434 |
| 6,293,121 | B1 | * | 9/2001 | Labrador | 62/304 |
| 7,036,801 | B2 | * | 5/2006 | Takamatsu et al. | 261/142 |

* cited by examiner

*Primary Examiner*—Scott Bushey
(74) *Attorney, Agent, or Firm*—Sughrue Mion, PLLC

(57) ABSTRACT

Provided is a heat treatment apparatus. The heat treatment apparatus includes a heating plate including a heater; a chamber case including a cooling chamber, and coupled to a lower portion of the heating plate; and at least one atomizing unit installed on the chamber case to generate liquid droplet aerosol by mixing a cooling liquid and a gas, and at the same time, to inject the liquid droplet aerosol into the cooling chamber.

17 Claims, 4 Drawing Sheets

Aerosol on
off
          Air cooling
     t1         time

FIG. 6B

Aerosol on
off
          Air cooling
     t2         time

HEAT TREATMENT APPARATUS

BACKGROUND OF THE INVENTION

This application claims the priority of Korean Patent Application No. 2004-45856, filed on Jun. 19, 2004, in the Korean Intellectual Property Office, the disclosure of which is incorporated herein in its entirety by reference.

FIELD OF THE INVENTION

The present invention relates to a heat treatment apparatus, and more particularly, a heat treatment apparatus including a cooling unit for cooling a heated substrate after heating the substrate in a photolithography process for manufacturing semiconductors.

DESCRIPTION OF THE RELATED ART

In a photolithography process for manufacturing a semiconductor, a heating process such as a pre-bake process, which heats a photoresist after applying the photoresist on a wafer, and a post-exposure bake process, which heats the photoresist after exposing the photoresist to be a predetermined pattern.

Recently, semiconductors are mass produced with multiple kinds, thus wafer heat treatment temperatures can be different according to the kinds of semiconductors. Therefore, for example, in a case where the wafer is heated at a temperature of 150° C. and next process should be performed at a temperature of 100° C., the wafer should be cooled down to the temperature 100° C. as soon as possible in order to improve the productivity.

Conventionally, in order to cool down a heating plate after heating the wafer using the heating plate, the heating plate is placed in the atmosphere, however, it takes a long time to reach the set temperature due to a low cooling performance.

FIG. 1 shows a conventional heat treatment apparatus including a cooling unit for cooling down a heating plate. Referring to FIG. 1, a case 66 forming a cooling chamber is disposed on a lower portion of the heating plate 70. Here, the wafer W is placed on an upper surface of the heating plate 70, and a heater 71 for heating the wafer W is disposed on a lower surface of the heating plate 70. In the cooling chamber, nozzles 74, which cool down the heating plate 70 heated by the heater 71 by injecting cooling gas that is induced through a ventilation hole 72 of the case 66 into the cooling chamber, are installed.

However, according to the conventional heat treatment apparatus, the heating plate 70 is forcedly cooled down by the cooling gas, thus the cooling performance increases higher than the heat treatment apparatus using a natural cooling method, however, there is a limit to perform the cooling operation more efficiently. In addition, since the cooling gas directly contacts the heater, humidity of the cooling gas should be removed in order to prevent the electricity from leaking.

SUMMARY OF THE INVENTION

The present invention provides a heat treatment apparatus having superior cooling performance and a simple structure, by injecting mist aerosol in a cooling chamber and cooling a heating plate using evaporation of the mist aerosol.

According to an aspect of the present invention, there is provided a heat treatment apparatus including: a heating plate including a heater; a chamber case including a cooling chamber, and coupled to a lower portion of the heating plate; and at least one atomizing unit installed on the chamber case to generate liquid droplet aerosol by mixing a cooling liquid and a gas, and at the same time, to inject the liquid droplet aerosol into the cooling chamber, wherein the heating plate is cooled down by evaporating the liquid droplet aerosol injected in the cooling chamber.

The atomizing unit may be installed so that a portion, through which the liquid aerosol is injected, can protrude into the cooling chamber.

The atomizing unit may include a first nozzle for injecting the cooling liquid and a second nozzle for injecting the gas, and the first nozzle is installed in the second nozzle.

At least one discharge hole, through which vapor generated by the evaporation of the liquid droplet aerosol is discharged, may be formed on the chamber case.

The atomizing unit may include a diffusion member that diffuses the injected liquid droplet aerosol.

The cooling liquid may include water, and the gas may include air.

A lower surface of the heating plate may be processed so as to increase a surface area, to which the liquid droplet aerosol contacts. Here, a capillary structure may be formed on the lower surface of the heating plate by a sintering process, or a plurality of grooves may be formed on the lower surface of the heating plate.

According to another aspect of the present invention, there is provided a heat treatment apparatus including: a heating plate including an upper plate, on which a substrate is mounted, a lower plate placed under the upper plate, and a heater placed between the upper plate and the lower plate to heat the substrate; a chamber case including a cooling chamber and coupled to a lower portion of the lower plate; and at least one atomizing unit installed on the chamber case to generate liquid droplet aerosol by mixing a cooling liquid and a gas, and at the same time, to inject the liquid droplet aerosol into the cooling chamber, wherein the heating plate is cooled down by evaporating the liquid droplet aerosol injected in the cooling chamber.

The atomizing unit may include a first nozzle for injecting the cooling liquid and a second nozzle for injecting the gas. The first and second nozzles may be connected to a first supplying tube that supplies the cooling liquid and a second supplying tube that supplies the gas, respectively. In addition, the first and second supplying tubes may include a first flow control device and a second flow control device for controlling flow amount of the liquid and the gas, respectively.

A lower surface of the heating plate may be processed so as to increase a surface area, to which the liquid droplet aerosol contacts. Here, a capillary structure may be formed on the lower surface of the heating plate by a sintering process, or a plurality of grooves may be formed on the lower surface of the heating plate.

The upper and lower plates may be formed of a metal, a ceramic, a glass, or a thermal-resistant resin.

A gasket may be disposed on a portion where the lower plate and the chamber case are coupled to each other.

According to still another aspect of the present invention, there is provided a cooling method of a heat treatment apparatus, which includes a cooling chamber under a heating plate and cools down the heating plate by injecting liquid droplet aerosol that is formed by mixing a cooling liquid and a gas into the cooling chamber, the method including: cooling the heating plate by continuously injecting the liquid droplet aerosol into the cooling chamber for a predetermined period; and removing vapor remaining in the cooling chamber by injecting only the gas into the cooling chamber.

The gas may be dry air.

According to yet still another aspect of the present invention, there is provided a cooling method of a heat treatment apparatus, which includes a cooling chamber under a heating plate and cools down the heating plate by injecting liquid droplet aerosol that is formed by mixing a cooling liquid and a gas into the cooling chamber, the method including: cooling the heating plate by injecting the liquid droplet aerosol in a pulse form into the cooling chamber for a predetermined period; and removing vapor remaining in the cooling chamber by injecting only the gas into the cooling chamber.

The injecting of the liquid droplet aerosol in a pulse form may include supplying the cooling liquid in a pulse form and supplying the gas continuously into the cooling chamber for a predetermined period.

BRIEF DESCRIPTION OF THE DRAWINGS

The above and other features and advantages of the present invention will become more apparent by describing in detail exemplary embodiments thereof with reference to the attached drawings in which:

FIG. 5A is a view showing a state where a capillary structure is formed by sintering on a lower surface of a lower plate in the heat treatment apparatus according to an exemplary embodiment of the present invention;

FIG. 5B is a view showing a state where a plurality of grooves are formed on the lower surface of the lower plate by processing in the heat treatment apparatus according to an exemplary embodiment of the present invention;

FIG. 6A is a view illustrating a cooling method of the heat treatment apparatus according to an exemplary embodiment of the present invention; and FIG. 6B is a view showing a cooling method of the heat treatment apparatus according to another exemplary embodiment of the present invention.

DETAILED DESCRIPTION OF THE INVENTION

Exemplary embodiments of the invention will now be described below by reference to the attached Figures. The described exemplary embodiments are intended to assist the understanding of the invention, and are not intended to limit the scope of the invention in any way.

Figure 1:
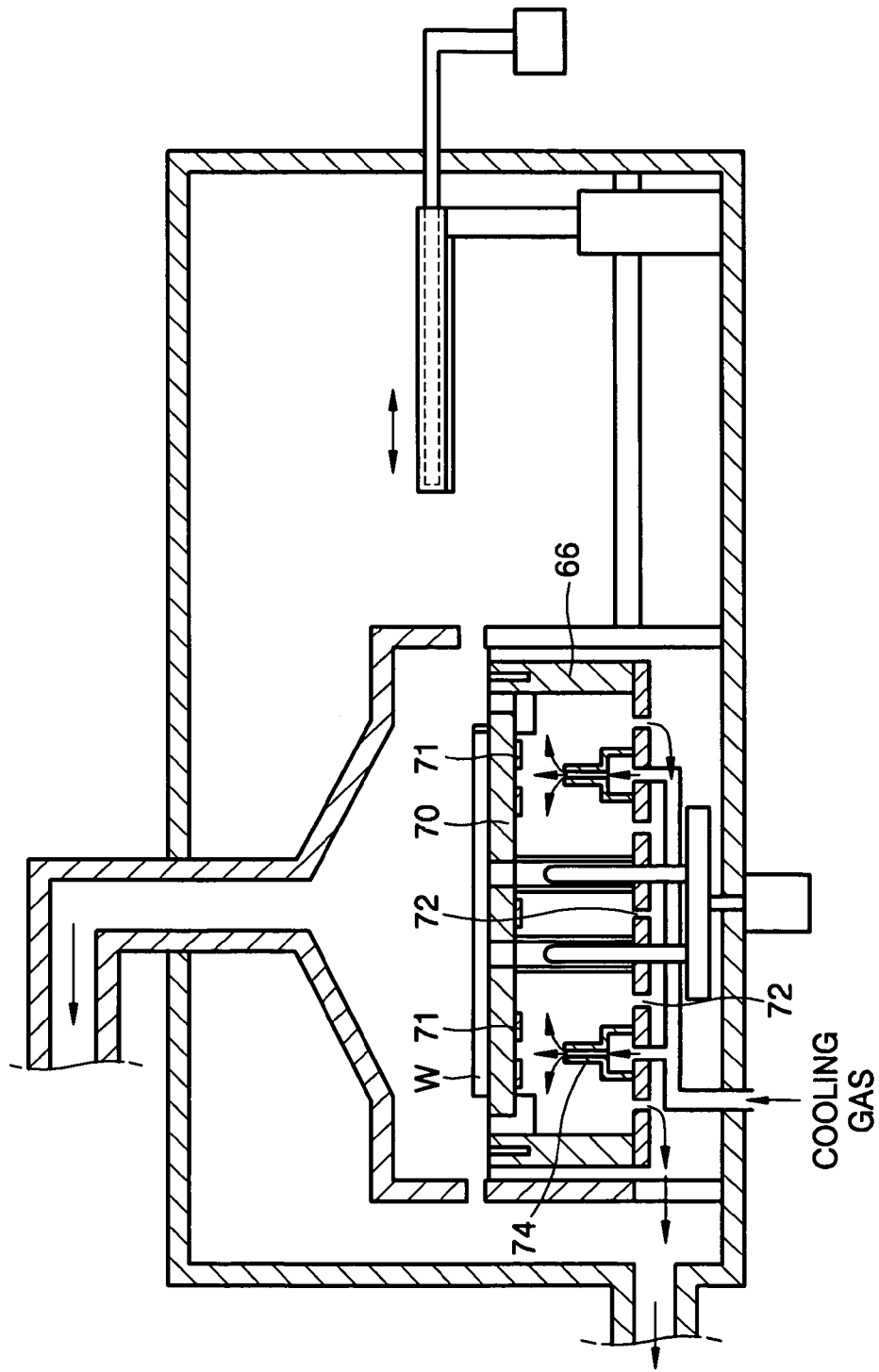
FIG. 1 is a view showing a conventional heat treatment apparatus.
Figure 2:
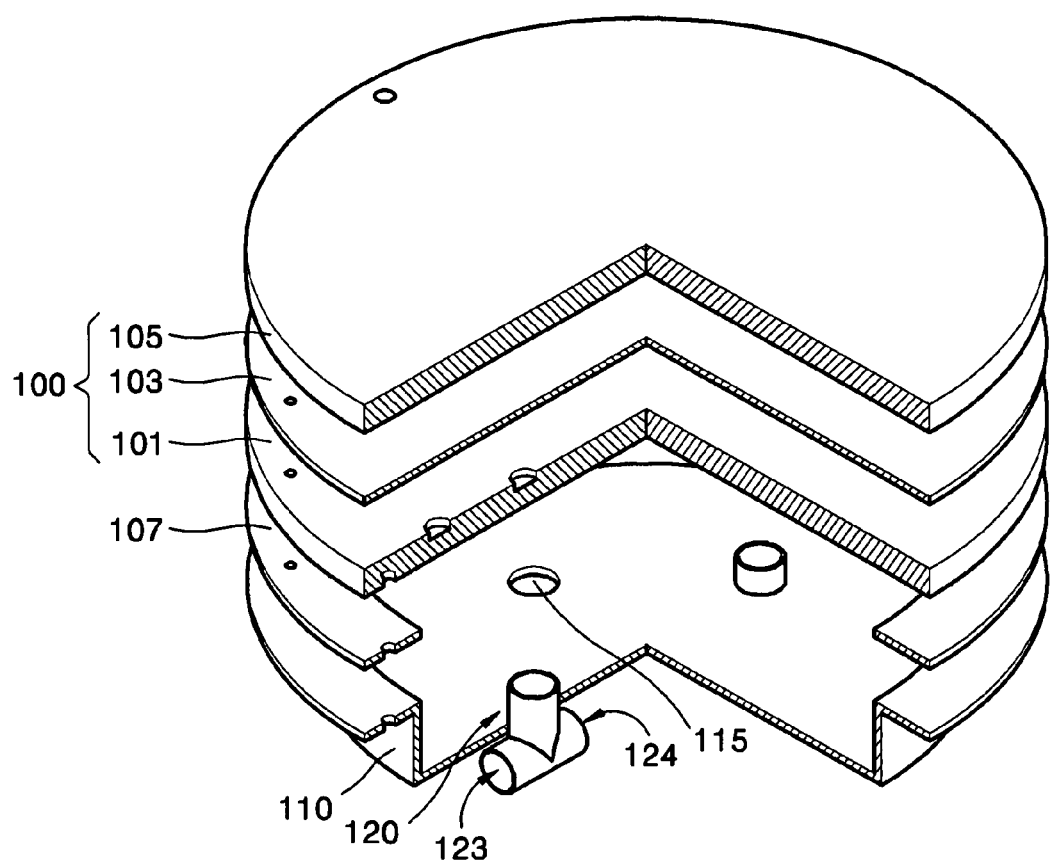
FIG. 2 is a cut perspective view showing a heat treatment apparatus according to an exemplary embodiment of the present invention.
Figure 3:
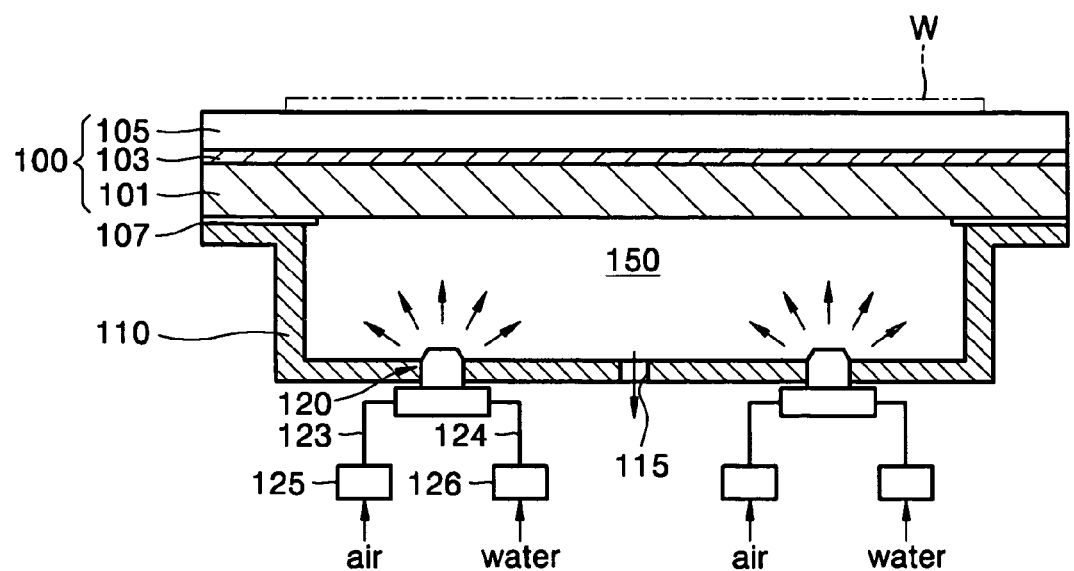
FIG. 3 is a schematic cross-sectional view showing a heat treatment apparatus according to an exemplary embodiment of the present invention.

FIG. 2 is a cut perspective view showing a heat treatment apparatus according to an exemplary embodiment of the present invention, and FIG. 3 is a schematic cross-sectional view showing the heat treatment apparatus shown in FIG. 2.

Referring to FIGS. 2 and 3, the heat treatment apparatus according to an exemplary embodiment of the present invention includes a heating plate 100, a chamber case 110 coupled to a lower portion of the heat plate 100, and at least one atomizing unit 120 installed on the chamber case 110.

The heating plate 100 includes an upper plate 105 and a lower plate 101, and a heater 103 disposed between the upper plate 105 and the lower plate 101. On the upper plate 105, a substrate, for example, a wafer W is disposed. In addition, the lower plate 101 becomes an upper wall of a cooling chamber 150, which will be described later. Here, the upper and lower plates 105 and 101 can be formed of a metal, a ceramic having high thermal conductivity, a glass, or a thermal-resistant resin. The heater 103 heats the wafer W disposed on the upper plate 105 to a predetermined temperature by applied electric current, and is formed of a heating resistant material.

The chamber case 110 is coupled to the lower portion of the lower plate 101 to form a cooling chamber 150 for cooling down the heating plate 100 that is heated by the heater 103 to a predetermined temperature. On the other hand, a gasket 107 for sealing the cooling chamber 150 is disposed on the coupled portion of the lower plate 101 and the chamber case 110.

The atomizing units 120 are installed on a lower wall of the chamber case 110 to generate liquid droplet aerosol of fine size by mixing cooling liquid and gas, and to inject the liquid droplet aerosol into the cooling chamber 150. Thus, the atomizing unit 120 is installed so that a portion through which the liquid droplet aerosol is injected protrudes inwardly in the cooling chamber 150. Here, the cooling liquid can be the water, and the gas can be the air.

The liquid droplet aerosol injected into the cooling chamber 150 cools down the heating plate 100 by being evaporated. In more detail, the liquid droplet aerosol injected into the cooling chamber 150 is attached on the lower surface of the lower plate 101, and the liquid droplet aerosol attached on the lower surface of the lower plate 101 takes the heat from the lower plate 101 and evaporates to cool down the heating plate 100.

The heat capacity required to completely vaporize the liquid of 1 g at a constant temperature is called the evaporation heat, and the evaporation heat of the water is 2270 J/g. Therefore, the heat capacity required to vaporize 1 g of water is 540 times more than the heat capacity 4.2 J that is required to raise the temperature of 1 g of water by 1° C. Thus, the cooling of the heat plate 100 using the evaporation of the cooling liquid, for example, the water as in an exemplary embodiment of the present invention, is a very effective cooling method.

At least a discharge hole 115 is formed on a lower wall of the chamber case 110, the vapor generated by the evaporation of the liquid droplet aerosol is discharged through the discharge hole 115.

On the other hand, FIG. 2 shows the two atomizing units 120 installed on the lower wall of the chamber case 110, however, the present exemplary embodiment is not limited thereto, one or more than three atomizing units 120 can be installed on the lower wall of the chamber case 110. Otherwise, the atomizing units 120 can be installed on a side wall of the chamber case 110. In addition, two or more discharge holes 115 can be formed on the lower wall or the side wall of the chamber case 110.

As described above, when the liquid droplet aerosol is generated by mixing the cooling liquid and gas, and at the same time, the generated liquid droplet aerosol is injected directly into the cooling chamber 150 by the atomizing units 120 installed on the chamber case 110, the supplied liquid droplet aerosol cools down the heating plate 100 by changing its phase without being lost, thus the heat plate 100 can be cooled down to a predetermined temperature rapidly.

Figure 4:
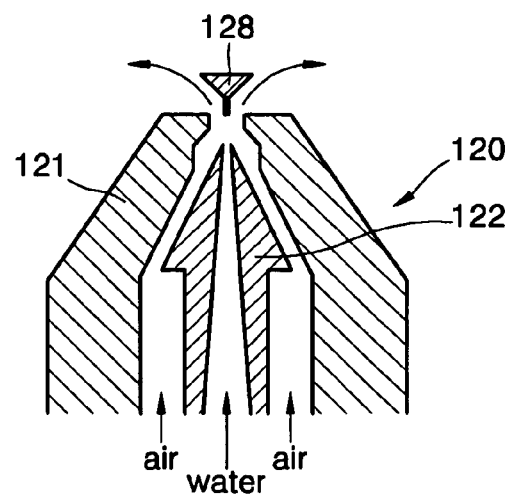
FIG. 4 is a cross-sectional view of the nozzle shown in FIG. 3.

FIG. 4 is a cross-sectional view showing an expanded view of the atomizing unit 120 shown in FIG. 3. Referring to FIG. 3, the atomizing unit 120 includes a first nozzle 122 that injects the cooling liquid, for example, the water, and a second nozzle 121 that injects the gas, for example, the air. Here, the first nozzle 122 is installed in the second nozzle 121. In the above structure, when the cooling liquid and gas are injected simultaneously through the first and second nozzles 122 and 121, the liquid droplet aerosol is generated, and the generated liquid droplet aerosol is injected into the cooling chamber 150. In addition, it is desirable that a diffusion member 128 is installed on a portion where the liquid droplet aerosol is injected for diffusing the injected liquid droplet aerosol in the cooling chamber 150 evenly.

The first nozzle 122 is connected to a first supplying tube 124 that supplies the cooling liquid, and the second nozzle 121 is connected to a second supplying tube 123 that supplies the gas. Here, the first and second supplying tubes 124 and 123 respectively include a first and a second flow control devices 126 and 125 for controlling flow amount of the cooling liquid and gas.

FIGS. 5A and 5B are cross-sectional views showing the lower surface of the lower plate 101. Referring to FIG. 5A, a capillary structure 101a is formed on the lower surface of the lower plate 101, and the capillary plate 101a is formed by applying a predetermined powder on the lower surface of the lower plate 101 and sintering the powder. When the capillary structure 101a is formed on the lower surface of the lower plate 101, the evaporation of the aerosol is performed while the liquid droplet aerosol is evenly applied on the entire lower surface of the lower plate 101. In addition, a surface area, to which the liquid droplet aerosol contacts, increases, thus cooling the heating plate 100 more efficiently. Referring to FIG. 5B, a plurality of fine grooves 101b are formed on the lower surface of the lower plate 101. The grooves 101b can be formed by processing the lower surface of the lower plate 101. In addition, the grooves 101b distribute the liquid droplet aerosol evenly on the lower surface of the lower plate 101, and increase the surface area contacting to the liquid droplet aerosol.

In the heat treatment apparatus having the above structure, when the liquid droplet aerosol is injected into the cooling chamber 150 by the atomizing units 120, the liquid droplet aerosol is attached onto the inner wall of the cooling chamber 150 including the lower surface of the lower plate 101. The liquid droplet aerosol attached on the inner wall of the cooling chamber 150 absorbs the heat of the peripheral portion and evaporates, and then is discharged through the discharge hole 115 in the vapor state. Then, the heating plate 100 can be cooled down to the desired set temperature.

When the heating plate 100 is cooled down using the phase change of the liquid droplet aerosol that is injected in the cooling chamber 150, the cooling can be performed rapidly. For example, in order to cool down the heating plate 100 from 150° C. to 100° C., it takes about 50 minutes in the conventional natural cooling method, however, it takes only about 90 seconds using the heat treatment apparatus of an exemplary embodiment of the present invention when the aerosol is injected in a rate of 100 ml/min.

Hereinafter, a cooling method of the heat treatment apparatus will be described with reference to FIGS. 6A and 6B.

FIG. 6A is a graph illustrating the cooling method of the heat treatment apparatus according to an exemplary embodiment of the present invention. Referring to FIG. 6A, the liquid droplet aerosol is injected into the cooling chamber 150 continuously by the atomizing unit (reference numeral 120 in FIG. 2) for a predetermined time t1. In that process, the cooling water and the gas are supplied into the cooling chamber 150 through the first and second nozzles 122 and 121. Accordingly, the heating plate 100 is cooled down to the desired temperature by the evaporation of the injected liquid droplet aerosol.

In addition, after cooling down the heating plate 100, the gas is only injected into the cooling chamber 150 by the atomizing unit 120 for a predetermined time. In that process, the gas is only supplied into the cooling chamber 150 through the second nozzle 121. Here, it is desirable that the gas is dry air that does not include humidity. When the gas such as the dry air is only injected into the cooling chamber 150, the vapor remaining in the cooling chamber 150 after performing the cooling of the heating plate 100 can be removed.

FIG. 6B is a graph illustrating a cooling method of a heat treatment apparatus according to another exemplary embodiment of the present invention. Referring to FIG. 6B, the liquid droplet aerosol is injected into the cooling chamber 150 by the atomizing unit 120 for a predetermined time t2 in a pulse form. In that process, the cooling liquid is supplied to the cooling chamber 150 intermittently in a pulse form through the first nozzle 122, and the gas is supplied to the cooling chamber 150 continuously through the second nozzle 121. Accordingly, the heating plate 100 is cooled down to the desired temperature by the evaporation of the injected liquid droplet aerosol.

In order to remove the vapor remaining in the cooling chamber 150 after performing the cooling of the heating plate 100, the gas is only injected into the cooling chamber 150 by the atomizing unit 120 for a predetermined time. In that process, the gas such as the dry air is supplied into the cooling chamber 150 through the second nozzle 121.

As described above, according to the heat treatment apparatus of the present invention, since the liquid droplet aerosol evaporates by contacting directly the heating plate to cool down the heating plate in the phase changing method, the cooling performance is improved.

In addition, the atomizing unit installed on the chamber case generates the liquid droplet aerosol by mixing the cooling liquid and gas, and at the same time, injects the liquid droplet aerosol into the cooling chamber. Thus, the supplied liquid droplet aerosol is not lost, and the heating plate can be cooled down to the desired temperature rapidly.

Also, since the liquid droplet aerosol is discharged through the discharge hole in the vapor state after being evaporated, the discharge device can be constructed in a simple structure without any possibility of leakage as in the conventional heat treatment apparatus using a liquid cooling method.

In the process of fabricating the semiconductor, a wafer baking process and a cooling process can be performed using one bake unit, thus improving the productivity.

While the present invention has been particularly shown and described with reference to exemplary embodiments thereof, it will be understood by those of ordinary skill in the art that various changes in form and details may be made therein without departing from the broad spirit and scope of the present invention as defined by the following claims.

What is claimed is:

1. A heat treatment apparatus comprising:
    a heating plate including an upper plate, on which a substrate is mounted, a lower plate placed under the upper plate, and a heater placed between the upper plate and the lower plate to heat the substrate;
    a chamber case including a cooling chamber and coupled to a lower portion of the lower plate; and
    at least one atomizing unit installed on the chamber case to generate liquid droplet aerosol by mixing a cooling liquid and a gas, and at the same time, to inject the liquid droplet aerosol into the cooling chamber,
    wherein the heating plate is cooled down by evaporating the liquid droplet aerosol injected in the cooling chamber.

2. The apparatus of claim 1, wherein the atomizing unit is installed so that a portion, through which the liquid aerosol is injected, can protrude into the cooling chamber.

3. The apparatus of claim 1, wherein the atomizing unit is installed on a lower wall of the chamber case.

4. The apparatus of claim 1, wherein the atomizing unit includes a first nozzle for injecting the cooling liquid and a second nozzle for injecting the gas.

5. The apparatus of claim 4, wherein the first nozzle is installed in the second nozzle.

6. The apparatus of claim 4, wherein the first and second nozzles are connected to a first supplying tube that supplies the cooling liquid and a second supplying tube that supplies the gas, respectively.

7. The apparatus of claim 6, wherein the first and second supplying tubes include a first flow control device and a second flow control device for controlling a flow amount of the liquid and the gas, respectively.

8. The apparatus of claim 1, wherein at least one discharge hole, through which vapor generated by the evaporation of the liquid droplet aerosol is discharged, is formed on the chamber case.

9. The apparatus of claim 8, wherein the discharge hole is formed on a lower wall of the chamber case.

10. The apparatus of claim 1, wherein the atomizing unit includes a diffusion member that diffuses the injected liquid droplet aerosol.

11. The apparatus of claim 1, wherein the cooling liquid includes water.

12. The apparatus of claim 1, wherein the gas includes air.

13. The apparatus of claim 1, wherein a lower surface of the heating plate is processed so as to increase a surface area, to which the liquid droplet aerosol contacts.

14. The apparatus of claim 13, wherein a capillary structure is formed on the lower surface of the heating plate by a sintering process.

15. The apparatus of claim 13, wherein a plurality of grooves are formed on the lower surface of the heating plate.

16. The apparatus of claim 1, wherein the upper and lower plates are formed of at least one of a metal, a ceramic, a glass, and a thermal-resistant resin.

17. The apparatus of claim 1, wherein a gasket is disposed on a portion where the lower plate and the chamber case are coupled to each other.

* * * * *